United States Patent [19]
Edelstein et al.

[11] Patent Number: 5,650,052
[45] Date of Patent: Jul. 22, 1997

[54] VARIABLE CELL SIZE COLLIMATOR

[76] Inventors: Sergio Edelstein, 116 El Altillo, Los Gatos, Calif. 95030; Nitin Khurana, 1700 Halford Ave. #205, Santa Clara, Calif. 95051; Keiji Miyamoto, Omigawa, Omigawa-machi, Katorigun, Chiba 289-03, Japan; Roderick C. Mosely, 4337 Diavila Ave., Pleasanton, Calif. 94588; William J. Murphy, 380 Old Stage Rd., Essex, Vt. 05452; Vijay Parkhe, 655 S. Fair Oaks Ave. #D108, Sunnyvale, Calif. 94086; James Van Gogh, 1239 Van Dyck Dr., Sunnyvale, Calif. 94087; Robert S. West, 15301 Fern Ave., Boulder Creek, Calif. 95006

[21] Appl. No.: 539,177
[22] Filed: Oct. 4, 1995
[51] Int. Cl.⁶ .................................................. C23C 14/34
[52] U.S. Cl. ............................. 204/192.12; 204/298.11
[58] Field of Search ...................... 204/192.12, 298.11

[56] References Cited

U.S. PATENT DOCUMENTS

| | | | |
|---|---|---|---|
| 5,415,753 | 5/1995 | Hurwitt et al. | 204/192.12 |
| 5,505,833 | 4/1996 | Werner et al. | 204/192.12 |

*Primary Examiner*—Aaron Weisstuch
*Attorney, Agent, or Firm*—Patterson & Streets

[57] ABSTRACT

Sputtering apparatus and method suitable for forming a step coating on a workpiece. A workpiece is supported in a chamber, particles are emitted from a sputtering source, and the particles are passed through a collimating filter having a plurality of transmissive cells positioned between the sputtering source and the workpiece to limit the angles at which the particles can be deposited onto the workpiece. The collimating filter varies in height from a center portion to an outer portion while preferably maintaining a constant cell aspect ratio.

22 Claims, 6 Drawing Sheets

VARIABLE CELL SIZE COLLIMATOR

BACKGROUND OF THE DISCLOSURE

1. Field of the Invention

This invention pertains generally to sputter coating and, more particularly, to an apparatus and a method for depositing a step coating on a workpiece by sputtering. More particularly still, the present invention relates to an apparatus and method for collimating sputtered material in a semiconductor processing chamber.

2. Background of the Art

Sputter coating is commonly employed in the formation of films on substrates in the manufacture of semiconductor devices, and planar magnetrons have long been used as sputtering devices to coat silicon substrates with various materials, such as titanium and aluminum, during the manufacture of integrated circuits.

With sputter coating, it is difficult to form a uniform thin film, or step coating, which conforms to the shape of a workpiece where a step occurs, e.g. at the upper or lower corner of an opening such as a hole or a via in the surface of a workpiece. As the density of devices on semi-conductor substrates increases and etching technology evolves, the aspect ratio of openings on the surface of semi-conductor substrates correspondingly continually changes such that the depth of an opening can exceed the width as shown in FIG. 1. FIG. 1 shows an opening 20 having an aspect ratio wherein the depth of the opening is approximately twice its width. It is difficult to fill small openings (e.g. one micron, or less, in diameter or width for a 1.2 micron depth) and to provide controlled film growth on the side 22 and bottom 24 walls of such openings. These difficulties arise because particles tend to leave the source in all directions, arriving at the workpiece from a variety of angles as shown in FIG. 2. Particles of escaping target material can leave the surface of the target at any angle and from any surface location as shown by the arrows in FIG. 2. When depositing target material onto a substrate having an opening with a high aspect ratio, the deposited material striking the upper portion of the opening at acute angles tends to close the mouth of an opening before the entire opening is completely filled such that a void 26 is formed within the opening as shown in FIG. 2. Such voids can cause long-term reliability problems in semi-conductor devices.

As shown in FIG. 3, a collimator 12 can be used to resolve such problems. A collimator 12 is a filtering plate positioned between a sputtering source 14 and a semi-conductor workpiece 16. A collimator 12 typically has a finite predetermined thickness and includes a number of passages 28 of predetermined dimensions formed through its thickness, through which the deposited material must pass on its path from the sputtering source 14 to the workpiece 16. The collimator 12 filters out target material that would otherwise strike the workpiece at acute angles exceeding a desired angle. The actual amount of filtering depends upon the aspect ratio of the passages 28 through the collimator 12, such that only deposited material within an angle of [arctan (cell width/cell height)] from the perpendicular can pass through the collimator 12 to strike the workpiece 16. Particles traveling on a path approaching normal to the workpiece 16 pass through the collimating plate 12 and deposit on the workpiece. This allows improved semi-conductor device manufacture for substrate devices formed with high aspect ratio holes, trenches, etc. The aspect ratio of the collimator cells is defined as the cell height over the cell width.

There are several disadvantages to the use of typical collimators. First, each particle of target material which strikes the upper surface 30 of the collimator plate 12 is deposited on the collimator. This can significantly reduce the efficiency of depositing material in a processing chamber because a portion of the target material is deposited on the collimator rather than the intended semi-conductor wafer and thus wastes target material.

Second, the deposited material strikes the sidewalls of the collimator cells when it enters the cell at an angle greater than [arctan (cell width/cell height)] from the perpendicular. Such material is thus deposited within and tends to clog the passages of the collimator. Additionally, material deposits on the planar surface of the collimator facing the target and existing between the individual cells. FIG. 4 illustrates how target material 34 deposits on the cell walls 32 and planar surfaces of a collimator. This deposition of material 34 onto the cell walls 32 increases the aspect ratio of the passages so that less material from the sputtering source 14 will pass through the collimator 12 and be deposited on the workpiece. This increases the throughput time of subsequent substrates which are processed at the same plasma energy to achieve the same thickness of deposited material.

Third, over the life of the sputtering source 14, the effective width of the collimator cells changes as target material 34 is deposited onto the collimator. The buildup of target material 34 on the collimator 12 causes poor film layer uniformities at the end of collimator life as represented graphically in FIG. 5 because a greater buildup of sputtered material on the cell walls will occur at some localized portion of the collimator as compared to the buildup on other portions of the collimator. This occurs because of the geometry of sputtering a planar surface to coat a planar surface. If the rate at which the target is sputtered is equal across the entire target surface, more target material will reach the center of the collimator than will reach its edge where the collimator is centered to the target center. This occurs because the material sputtered from any point on the target will leave the target in a fan-shaped cosine distribution. The material sputtered from the center of the target will deposit on the center of the collimator all the way to the collimator edge, with a declining deposition rate as the collimator edge is approached. Those particles sputtered from the edge of the target are as likely to travel inwardly of that location as outwardly of that location, such that a substantial portion of the material sputtered from the target edge will not reach the collimator or substrate. This results in a greater deposition thickness at the center of the collimator because material reaches it from both the center and edge of the target. This sputtering profile can be changed by placing a magnetron apparatus behind the target to create annular regions of high rate sputtering which are designed to create a more uniform deposition thickness on the substrate, i.e., to compensate for the tendency to over deposit on the substrate center by reducing the sputtering rate at the center of the target as compared to the target edge. However, these magnetron systems must be designed with a specific target to substrate spacing to optimize deposition thickness uniformity. The location of the high sputtering rate region of the target must be related to the fan shaped sputtering distribution and the distance between the substrate and the target. Where a collimator is located intermediate the substrate and target and target erosion is optimized to provide uniform thickness film layer on the substrate, the rate of deposition on the collimator surfaces will vary over the diameter of the collimator.

FIG. 6 depicts how cell width decreases over the life of the sputtering source. Over the life of the collimator, cell width decreases more in the center portion of the collimator relative to the outer portion of the collimator where a uniform erosion of the target is present. The use of standard collimators with uniform cell size and aspect ratio as shown in FIG. 3 often leads to problems of poor film uniformities as a result of a differential thickness layer being formed across the surface of the collimator.

There exists a need for a collimator for use in semiconductor processing which improves film layer thickness uniformity, both on a substrate and from substrate to substrate. There also exists a need for a collimator which provides a uniform deposition despite varying changes in the cell aspect ratio over the diameter of the collimator during its life.

SUMMARY OF THE INVENTION

The present invention provides an apparatus and method for improving the uniformity of sputtered film layers on a workpiece. The apparatus includes a collimating plate comprising a plurality of transmissive cells which vary in size, including at least in height or width.

The method includes, in one aspect, the steps of positioning a collimating plate between a sputtering source and workpiece and providing a gap between the upper surface of the cells of the collimating plate and the sputtering source, or between the lower surface of the cells and the substrate, which varies in height in one aspect from the center portion of the collimating plate to the outer portion of the collimating plate.

The apparatus and method of the present invention provide both improved film uniformity and uniform bottom coverage over the life of the target.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DESCRIPTION OF THE PREFERRED EMBODIMENT

Figure 1:
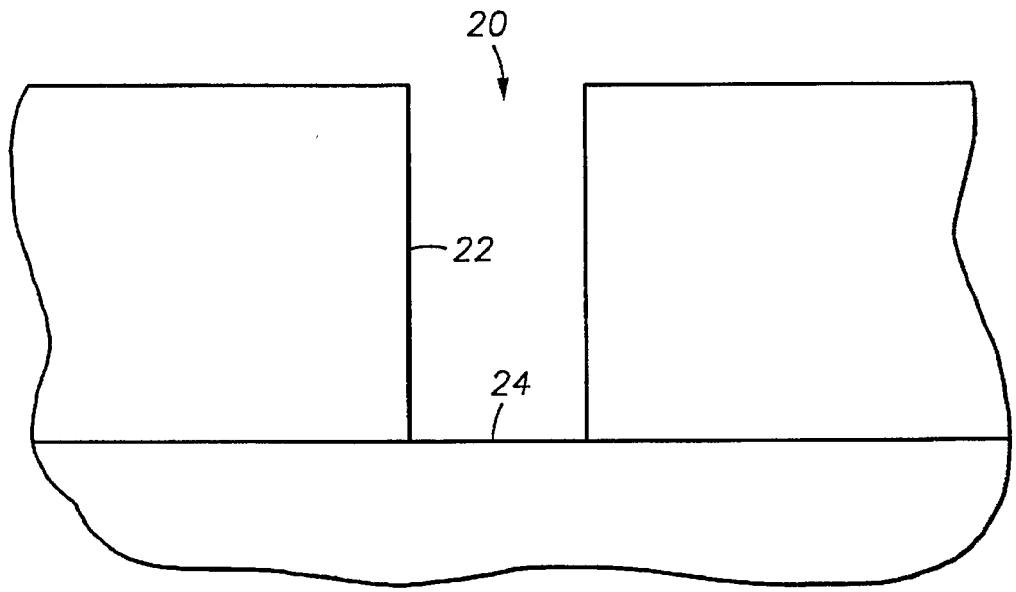
FIG. 1 is a partial cross-sectional view illustrating a via in a substrate having an aspect ratio on the order of 2:1.
Figure 2:
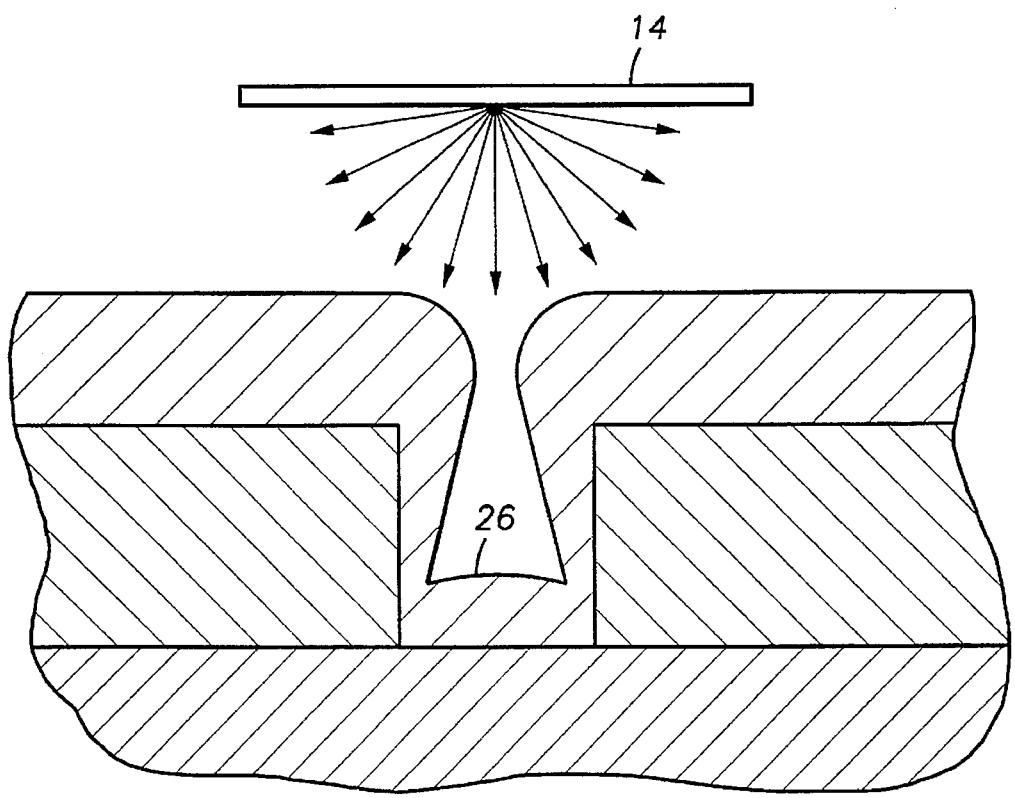
FIG. 2 is a partial cross-sectional view of a target and workpiece having a deposition layer thereon and defining a via therein and illustrating problems encountered in the formation of a step coating with conventional sputtering techniques.
Figure 3:
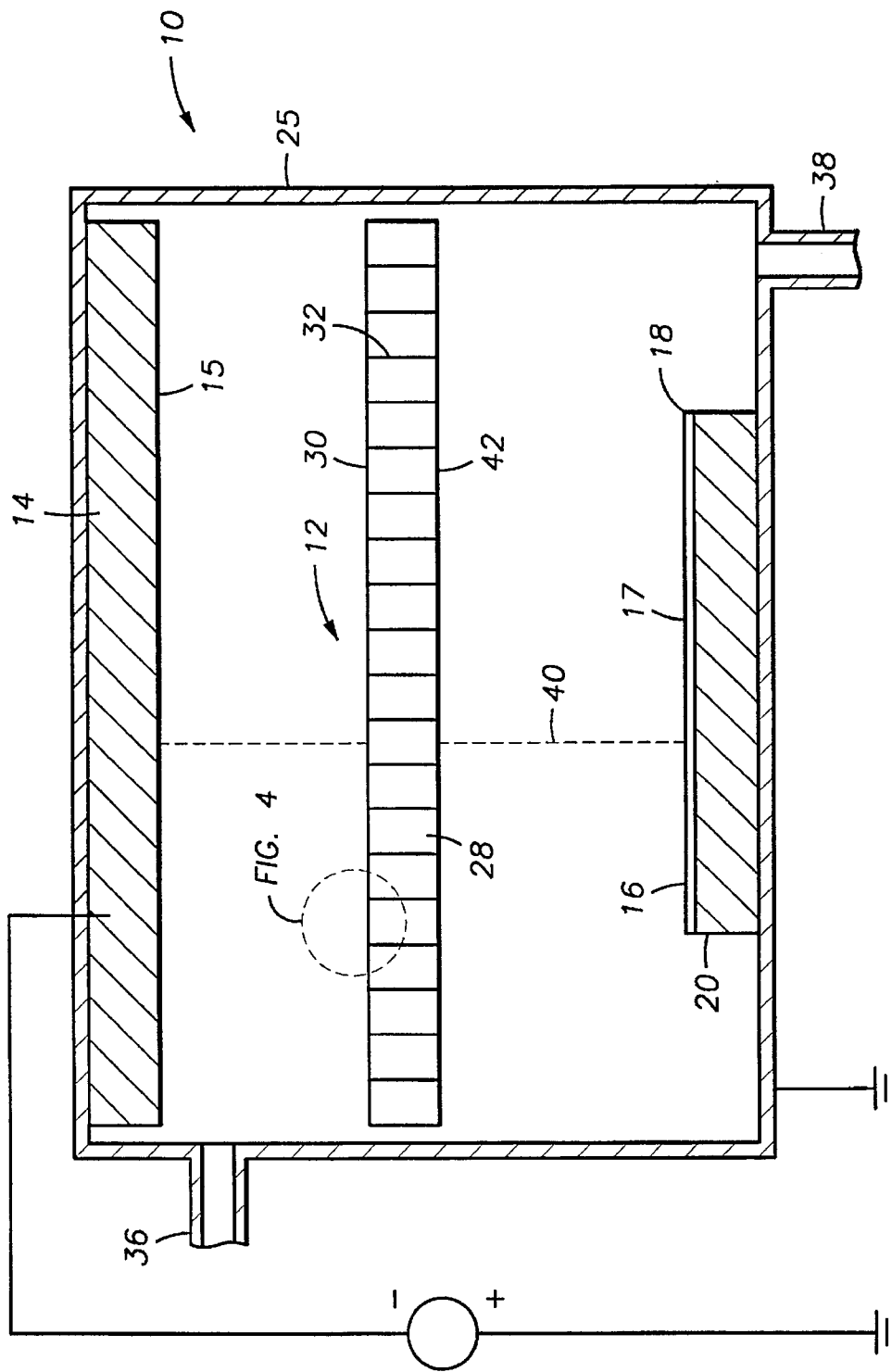
FIG. 3 is a diagrammatic cross-sectional view of a prior sputtering apparatus incorporating a collimation plate.
Figure 4:
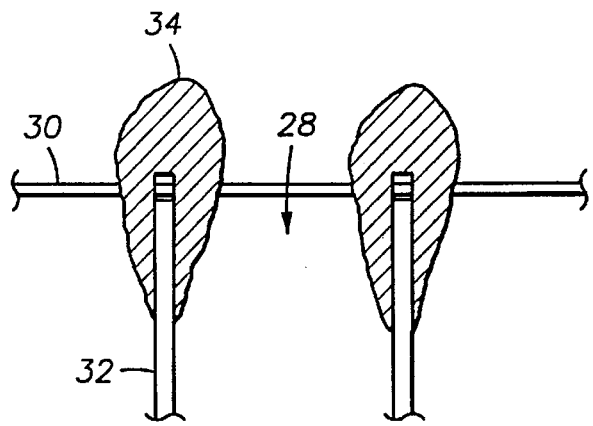
FIG. 4 is a partial cross-sectional view of the cell walls of a collimating plate depicting material buildup thereon.
Figure 6:
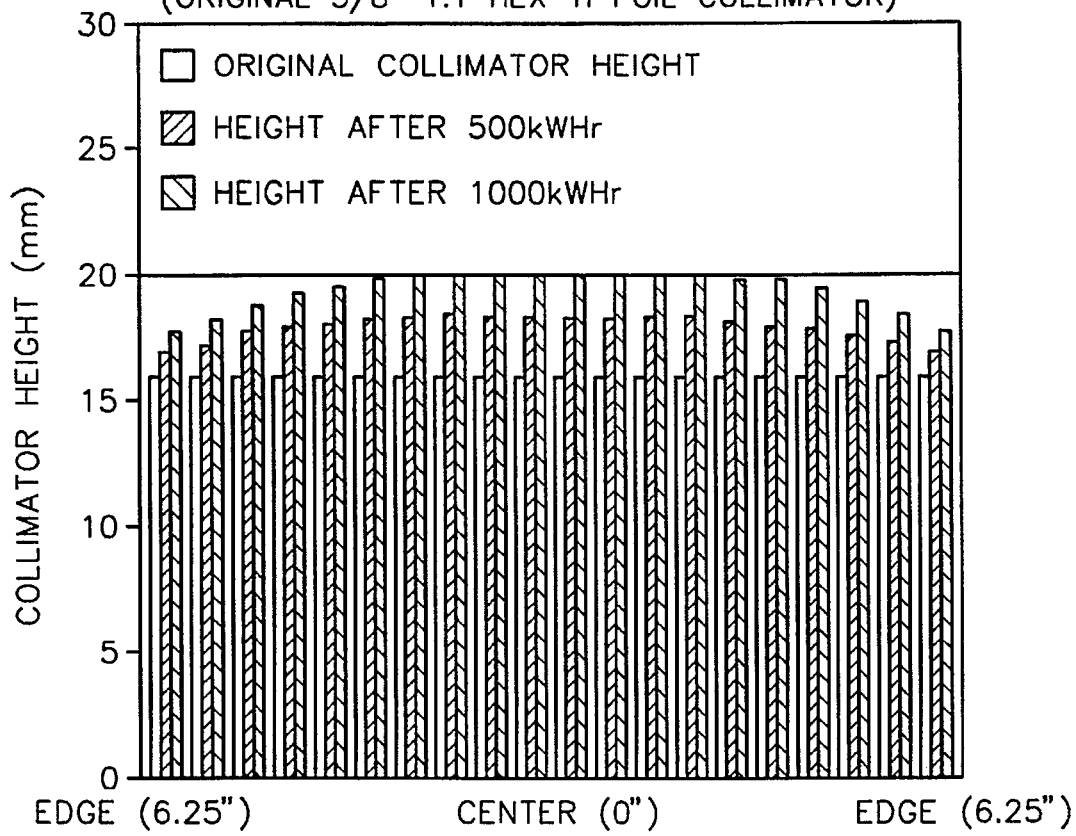
FIG. 6 is a graphical representation showing cell width change over the life of the target.

The sputtering apparatus and technique of the present invention generally contemplates positioning a variable cell size collimator 12 between a sputtering source 14, such as a target, and a workpiece 16 in a conventional sputter deposition chamber 10 as shown in FIG. 3. The variable cell size collimator 12 filters the flux of atoms and particles leaving the sputtering source 14 as the flux passes through the vicinity of the collimator 12 to provide a substantially uniform deposition flux at the edge 18 and center 17 of the workpiece 16 over the useful life of the collimator 12. The collimator 12 is sized and positioned, as will be further discussed herein, to provide a substantially uniform deposition flux without significantly changing the uniformity of the thickness of the deposition layer formed on the workpiece 16 over the life of the collimator 12. Cell size, including height and width as well as cell aspect ratio, can be varied to account for various target erosion profiles to achieve uniform film layer deposition and bottom coverage. The variable cell size collimator 12 improves the uniformity of film thickness and bottom coverage on substrates over the life of the collimator 12. The more uniform, as compared to prior art, flux of sputtering material provided over the entire surface of the workpiece 16 over the life of the collimator 12 ensures that the conformal deposition layer formed in each of the holes or vias in the upper most surface of the workpiece 16 will be more uniform and the thickness of the film layer will have minimum variation from hole to hole, as compared to prior art collimators having uniform cell size.

Referring still to FIG. 3, the preferred chamber configuration for providing the flux of target atoms and particles includes a conventional vacuum chamber 10 having a conventional sputtering source 14 such as a target suspended therein. One suitable chamber and target is disclosed in U.S. Pat. No. 5,242,566, Parker, the disclosure of which is fully incorporated herein by reference. To implement the invention, the otherwise conventional apparatus includes a mechanism, described below, for collimating the target material flux and providing a more uniform distribution of sputtering material to each location on the workpiece 16 over the life of the collimator 12.

The workpiece 16 is received in the chamber 10 and positioned on a pedestal 20 for deposition of sputtered target material thereon. The material layer may, if desired, be formed over one or more dielectric, metal or other layers previously formed on the workpiece 16, and may fill holes or vias in dielectric or other layers of the workpiece 16 to form a via or contact. Although the present invention is described in terms of forming a conformal film layer in trenches, holes or vias, the invention is equally applicable to the formation of film layers in other aperture geometries. It is also specifically contemplated that various target materials may be used with the present invention, including Al, Ti, W, and Cu, etc.

Referring still to FIG. 3, vacuum chamber 10 generally includes a chamber enclosure wall 25, having at least one gas inlet 36 and an exhaust outlet 38 connected to an exhaust pump (not shown). The substrate support pedestal 20 is disposed at the lower end of the chamber 10, and the target 14 is received at the upper end of the chamber 10. The target 14 is electrically isolated from the enclosure wall 25 and the enclosure wall is preferably grounded, so that a negative voltage may be maintained on the target 14 with respect to the grounded enclosure wall 25. To form the deposition material layer on the workpiece 16, the workpiece 16 is first passed through a load lock (not shown) in the enclosure wall 25, and positioned within the chamber 10 by a robot arm, blade or other device on the support pedestal 20. During the deposition process, a gas, typically a non-reactive species such as Ar, is charged into the vacuum chamber 10 through the gas inlet 36 at a selected flow rate regulated by a mass flow controller. The chamber pressure may be controlled by throttling the rate at which the chamber gases are pumped through the exhaust outlet 38.

A DC power supply applies a negative voltage to the target 14 with respect to the enclosure wall 25 to excite the gas into a plasma state. Ions from the plasma bombard the target 14 and sputter atoms and other particles of target material from the target 14 onto the substrate 16.

A conventional magnetron sputtering source employs a magnetron assembly (not shown) above the target 14 to increase the concentration of plasma ions adjacent to the sputtering surface of the target 14, and particularly in one or more annular regions intermediate the center and the perimeter of the target. Conventionally, the target 14 is supplied to the chamber with a planar sputtering surface 15 as shown FIG. 3. However, the present invention can be used to advantage in all types of sputtering source configurations including non-planar targets. The particles sputtered from the target 14 travel and attach to the exposed surfaces within the chamber 10, including the workpiece 16. The magnetron apparatus is configured to provide a deposition layer of relatively uniform thickness on the surface of the workpiece 16 in the absence of a collimation device where the target 14 and the workpiece 16 are closely spaced, i.e., less than approximately four inches apart. The design of such an apparatus is well known to those skilled in the art.

Figure 5:
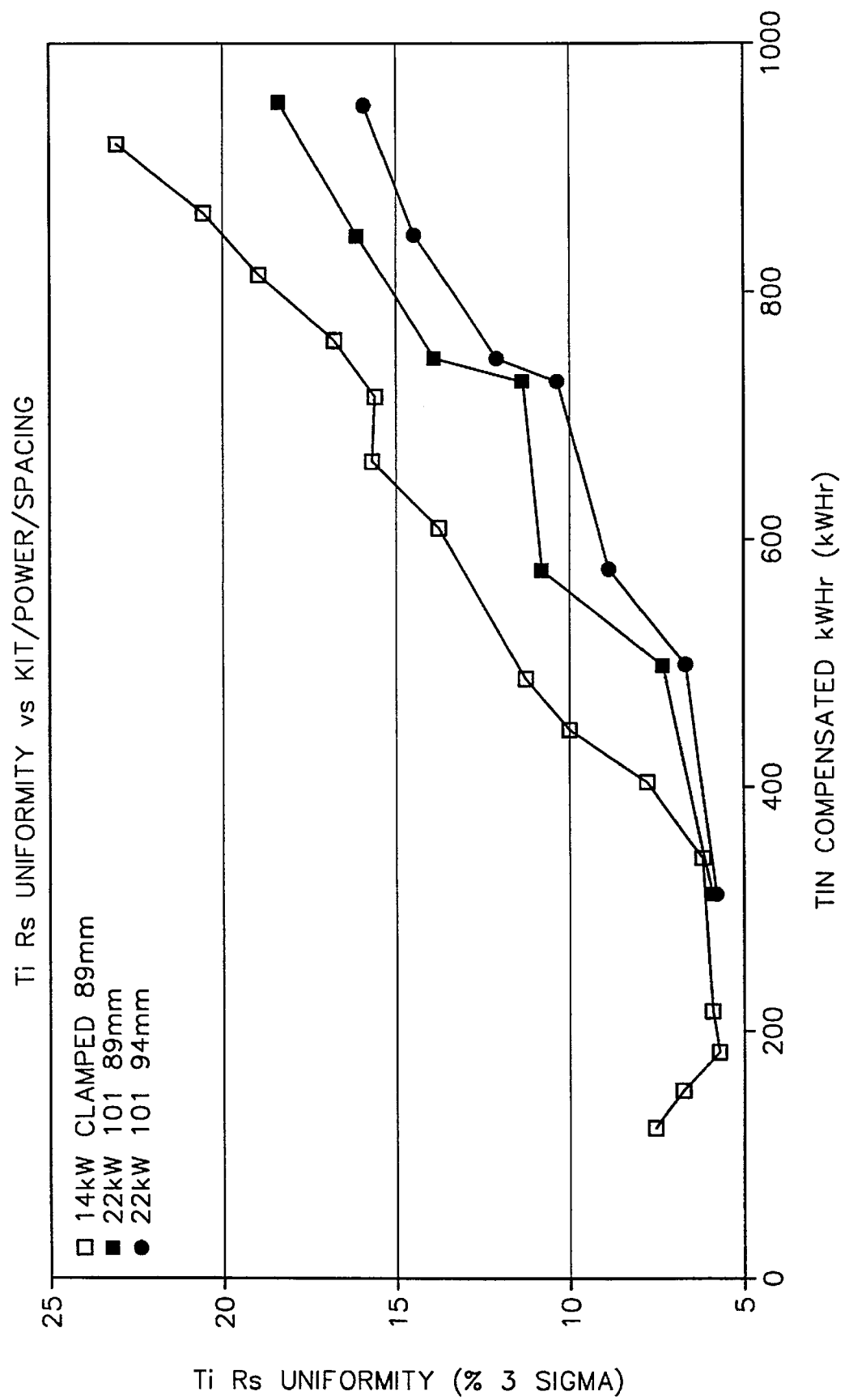
FIG. 5 is a graphical representation showing the relationship between film uniformity and processing time for the standard collimator.
Figure 5A:
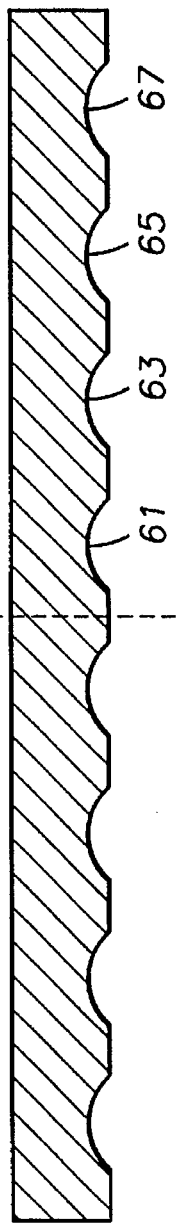
FIG. 5A is a cross-sectional view of a target depicting the erosion profile of the target.

With the target erosion profile of FIG. 5A, where the scalloped regions 61, 63, 65, 67 correspond to annular regions of high sputtering rate, material buildup on a collimator is thickest in the center of the collimating plate and thinnest along the outer edge of the plate. As a result, the cell aspect ratio of the cells located toward the center of the collimating plate changes more over time than does the aspect ratio of cells located on the outer edge of the plate, thereby restricting or screening out material that would otherwise deposit on the substrate to a greater extent at the center of the collimator than at the collimator edge. As a result, the quantity of material depositing at the center of the substrate declines as each new substrate is processed. The collimating plate of the present invention ameliorates this problem.

The collimator 12 of the present invention is used to advantage by positioning the collimator between the target 14 and workpiece 16 to limit the angles at which the particles from the source can arrive at the surface of the workpiece. This collimator, used at a chamber pressure wherein the mean free path of collision between atoms in the chamber exceeds the distance between the target and the substrate, provides predictable and relatively uniform deposition on the bottom and side walls of an opening, such as a hole or via, both within a single substrate and from substrate to substrate over numerous processing cycles, by reducing the effect of film layer growth on the cell walls on the resulting film layer formed on the substrate.

The collimating filter has a plurality of apertures 28 defining transmissive cells through which the sputtered particles pass in line-of-sight fashion. The cells are aligned with their axes parallel to axis 40 and perpendicular to the surfaces of target 14 and workpiece 16. Each cell has an acceptance angle $q_{ACC}$ which is defined as $$q_{ACC} = \arctan(d/l)$$

where d is the diameter of the aperture and l is the length of the aperture, or the height of the cell. The acceptance angle is thus the maximum angle from the perpendicular at which particles can pass through the filter without striking the walls 32 of the cells. The aspect ratio of the cells, i.e., the ratio of the cell height to the diameter, is referred to as the aspect ratio of the filter.

Generally, the filtering plate of the present invention defines a plurality of transmissive cells which have an upper surface 30 adjacent the target 14 and a lower surface 42 adjacent the workpiece 16. The upper surface 30 of the cells and the target 14 define a gap therebetween. Similarly, the lower surface 42 of the cells and the workpiece 16 define a gap therebetween. The present invention contemplates providing a collimating filter whose upper surface defines a gap between this upper surface and the target which varies in height from the center portion to the outer portion. The collimating filter may either increase or decrease in height from the center portion of the collimating filter to the outer portion of the collimating filter. In addition to the variation in height, the cells may vary in width or diameter from the center portion of the collimating filter to the outer portion of the filter.

The cells are preferably hexagonal in cross-section. This shape is preferred to a circular shape or a square shape because the packing factor of hexagonal cells is greater, i.e., more cells are provided per unit area of collimator. To achieve varying cell width while maintaining a high packing factor, the cell wall thickness is increased in cells where a smaller diameter is desired. In this disclosure, the diameter utilized in defining the acceptance angle and the aspect ratio of the hexagonal cells is the mean diameter of the cells, although either the flat-to-flat diameter or the apex-to-apex diameter could be utilized for this purpose, if desired.

The collimating filter is positioned midway between the target and the workpiece and is attached to a mounting bracket by brackets and screw.

Preferably, the collimating filter has an aspect ratio range on the order of 1:1 to 3:1., with a cell diameter ranging from one half inch (½ in.) to three quarters of an inch (¾ in.). Similarly, the cells in the center portion of the collimator preferably have an aspect ratio on the order of 1:1 to 3:1, and a cell diameter ranging from one half inch (½ in.) to three quarters of an inch (¾ in.). The cells in the outer portion of the collimator preferably have an aspect ratio on the order of 1:1 to 3:1, and a cell diameter ranging from one half inch (½ in.) to three quarters of an inch (¾ in.).

Figure 7:
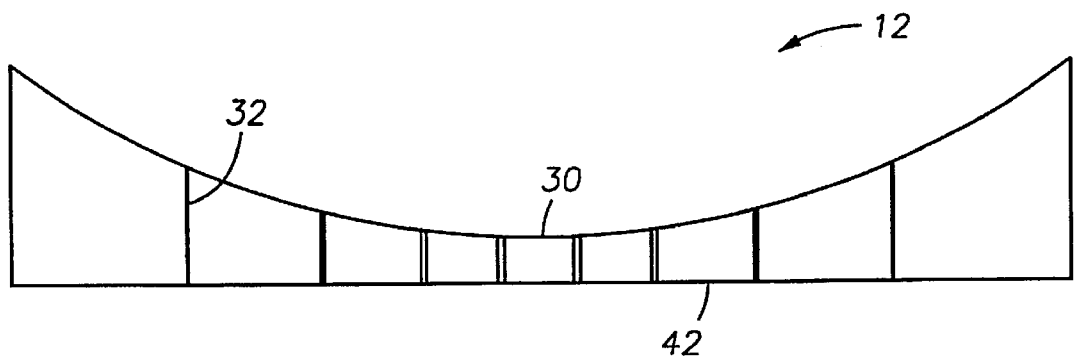
FIG. 7 is a cross-sectional view of an embodiment of the collimating plate of present invention.

In the preferred embodiment shown in FIG. 7, the collimating plate 12 shown in cross section is comprised of a plurality of transmissive cells which collectively form a concave upper surface 30 adjacent the target 14. Similarly, the cells collectively form a lower surface of the collimating filter which is co-planar with the workpiece 16. As a result, the cells at the center of the plate are shorter than those adjacent the outer diameter of the plate. The plurality of transmissive cells vary in width. Preferably, the cells in the center of the plate are smaller in diameter than the cells located on the outer edge of the plate. In other words, the cell diameter and height increases as the distance from the center of the collimating plate increases, while maintaining a constant cell aspect ratio. The variation in cell height and diameter results in both improved film uniformity and uniform bottom coverage, because a greater film thickness on the center cells than that deposited on the outer cells results in an equal change in cell aspect ratio. In the case of a collimator with hexagonal cells, cell height can be varied and the cell wall thickness can be made to increase with increasing distance from the center in such a way that the cell height to inner cell diameter ratio is kept constant as shown in FIG. 7.

Figure 8:
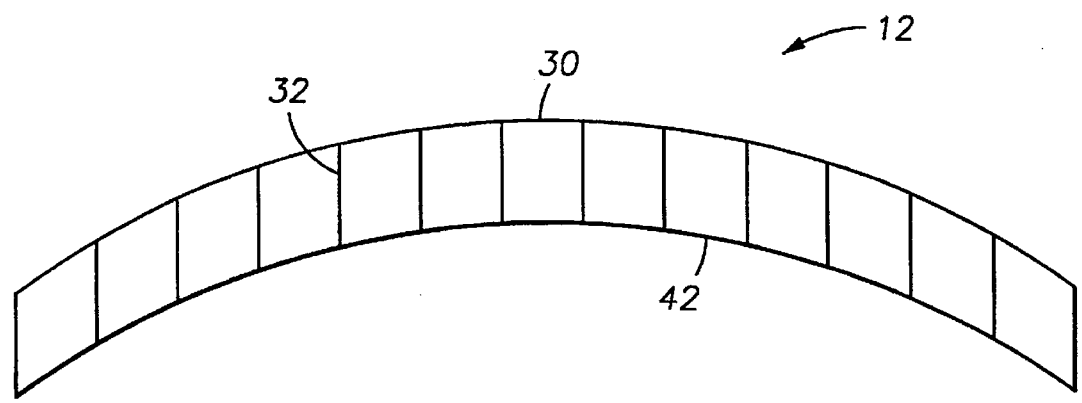
FIG. 8 is an alternative embodiment of the present invention.

In an alternative embodiment shown in FIG. 8, the collimator design provides flexibility to vary the cell height and diameter. The transmissive cells of the collimating filter 12 collectively form a convex upper surface 30 adjacent the sputtering source 14 and a concave lower surface 42 adjacent the workpiece 16. Preferably, the cells are uniform in height, but may vary in diameter, and thus aspect ratio as a function of distance from the center of the plate to the outer edge of the plate.

Figure 9:
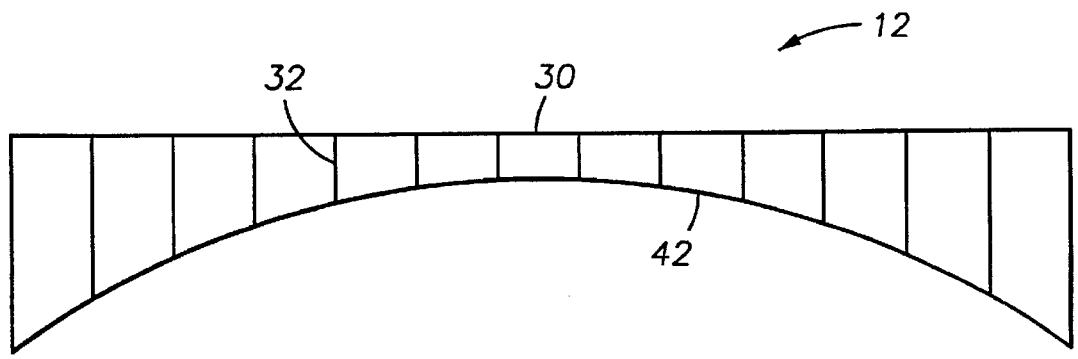
FIG. 9 is an alternative embodiment of the present invention.

In another embodiment as shown in FIG. 9, the transmissive cells of the collimating filter form a planar upper surface 30 adjacent the target and a concave lower surface 42 adjacent the workpiece 16. The cells increase in height as the distance from the center portion of the collimating filter increases. The cells may vary in diameter as a function of distance from the center portion of the filter to the outer edge or may have equal diameter to create an increasing aspect ratio as the edge of the collimator is approached.

Figure 10:
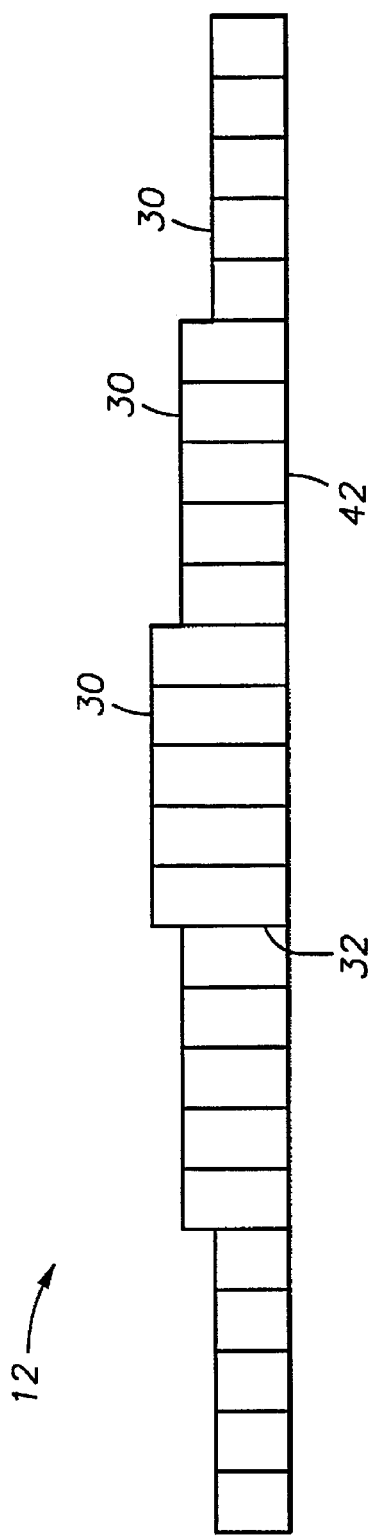
FIG. 10 is an alternative embodiment of the present invention.

In another embodiment shown in FIG. 10, a collimator 12 is shown having a stepped upper surface adjacent the target. The lower surface 42 adjacent the substrate is preferably planar. While the embodiment of FIG. 10 shows cells 28 having equal width and varying height, the present invention contemplates varying cell width as well as the height. In the embodiment shown, the aspect ratio of the collimating cells 28 varies between each stepped surface.

Although a preferred embodiment of the invention is described with the shortest cells, i.e., those with the smaller aspect ratio, at the center of the collimator, they can be located at the location where minimum deposition on the collimator will occur.

Cell height and aspect ratio can be customized to particular target erosion profiles to account for varying deposition rates of material onto various portions of the collimator. In one aspect of the invention, the erosion pattern shown in FIG. 5A tends to deposit target material on the center portion of the collimating plate. To account for this erosion pattern and to provide uniform deposition of target material onto the workpiece over the life of the target, the cells located in the center portion of the plate are shorter than those on the outer edge of the plate. In other words, the upper surface of the plate is dished to provide better film layer uniformity and bottom coverage. If the erosion profile results in the greatest deposition in an annular ring on the collimator, then the reduced thickness region or higher aspect ratio region is in that region of the collimator.

While the foregoing is directed to the preferred embodiment of the present invention, other and further embodiments of the invention may be devised without departing from the basic scope thereof, and the scope thereof is determined by the claims which follow.

We claim:

1. An apparatus for sputter depositing a film on a workpiece, comprising:

a) a chamber enclosing a sputtering source and a substrate support member, the substrate support member having a generally planar workpiece receiving surface disposed generally parallel to the sputtering surface of the sputtering source; and b) a collimator mounted between the sputtering source and the workpiece having a plurality of particle transmissive cells therein, the transmissive cells being variably spaced from the sputtering source and allowing sputtered material to pass therethrough in a direction toward the substrate when the collimator is mounted below the sputtering source;

c) wherein the collimator has upper and lower surfaces, at least one of said surfaces being a convex surface or a concave surface.

2. The apparatus of claim 1, wherein the collimator has a concave lower surface thereon.

3. The apparatus of claim 2, wherein the transmissive cells vary in height from a center portion of the collimator to an outer portion of the collimator.

4. The apparatus of claim 3, wherein the transmissive cells vary in width from the center portion to the outer portion.

5. The apparatus of claim 4, wherein the transmissive cells increase in width from the center portion to the outer portion.

6. The apparatus of claim 5, wherein the aspect ratio of the each cell is equal.

7. The apparatus of claim 2, wherein the collimator has a convex upper surface.

8. The apparatus of claim 1, wherein the collimator has a planar lower surface.

9. A method of forming a deposition layer on a substrate, comprising the steps of:

a) providing a sputter deposition chamber having at least a target and a substrate therein;

b) sputtering the target to provide a flux of target particles for deposition on the substrate; and c) placing a collimator having a plurality of particle transmissive cells therein intermediate the substrate and the target, the collimator having upper and lower surfaces, at least one of said surfaces being a convex surface or a concave surface such that a portion of the target particles sputtered from the target pass through the apertures provided in the collimator and deposit on the substrate.

10. The method of claim 7, wherein the collimator has a convex upper surface and a concave lower surface.

11. A physical vapor deposition device for depositing material onto a semi-conductor workpiece, comprising:

a) a chamber;

b) vacuum means for evacuating the chamber of air;

c) a target of material to be deposited onto the workpiece mounted in the chamber;

d) means for sputtering the target material;

e) a workpiece support member located in the chamber for holding the workpiece; and f) a collimator mounted between the target and the workpiece, the collimator comprising a plate of electrically non-conductive material having a plurality of passages therein and having upper and lower surfaces, at least one of said surfaces being a convex surface or a concave surface, the passages sized to account for greater material buildup in the center of the collimator relative to the outer edge throughout the life of the target.

12. The device of claim 11, wherein the collimator has a convex upper surface and a concave lower surface.

13. A filter member for use in a semiconductor processing apparatus, comprising:
  a) a filter plate having opposed major surfaces, at least one of said surfaces being a convex surface or a concave surface; and
  b) the plate comprising a plurality of cells defined by a plurality of cell walls generally perpendicular to said opposed major surfaces.

14. The filter member of claim 13, wherein the plate has a convex surface.

15. The filter member of claim 13, wherein the plate has a concave surface.

16. The filter member of claim 15, wherein the plate has a convex upper surface and a concave lower surface.

17. An apparatus for sputter depositing a film on a workpiece, comprising:
  a) a chamber enclosing a sputtering source and a substrate support member, the substrate support member having a generally planar workpiece receiving surface disposed generally parallel to the sputtering surface of the sputtering source; and
  b) a collimator mounted between the sputtering source and the workpiece and having a plurality of particle transmissive cells therein, the transmissive cells being variably spaced from the sputtering source and allowing sputtered material to pass therethrough in a direction toward the substrate when the collimator is mounted below the sputtering source;
  c) wherein the collimator has a concave upper surface and a planar lower surface.

18. An apparatus for sputter depositing a film on a workpiece, comprising:
  a) a chamber enclosing a sputtering source and a substrate support member, the substrate support member having a generally planar workpiece receiving surface disposed generally parallel to the sputtering surface of the sputtering source; and
  b) a collimator mounted between the sputtering source and the workpiece and having a plurality of particle transmissive cells therein, the transmissive cells being variably spaced from the sputtering source and allowing sputtered material to pass therethrough in a direction toward the substrate when the collimator is mounted below the sputtering source;
  c) wherein the collimator has an upper and lower surface;
  d) wherein the transmissive cells vary in height from a center portion of the collimator to an outer portion of the collimator; and
  e) wherein the transmissive cells vary in width from the center portion to the outer portion.

19. The apparatus of claim 18, wherein the transmissive cells increase in width from the center portion to the outer portion.

20. The apparatus of claim 19, wherein the aspect ratio of each transmissive cell is equal.

21. An apparatus for sputtering depositing a film on a workpiece, comprising:
  a) a chamber enclosed a sputtering source and a substrate support member, the substrate support member having a generally planar workpiece receiving surface disposed generally parallel to the sputtering surface of the sputtering source; and
  b) a collimator mounted between the sputtering source and the workpiece and having a plurality of particle transmissive cells therein, the transmissive cells being variably spaced from the sputtering source and allowing sputtered material to pass therethrough in a direction toward the substrate when the collimator is mounted below the sputtering source;
  c) wherein the collimator has an upper and lower surface; and
  d) wherein the upper surface presents a convex surface adjacent the sputtering source and the lower surface presents a concave surface adjacent the workpiece.

22. The apparatus of claim 21, wherein the cell height is uniform.

* * * * *